US012603308B2

(12) United States Patent
Hill

(10) Patent No.: US 12,603,308 B2
(45) Date of Patent: Apr. 14, 2026

(54) GLUELESS REPEATABLE FINGER ATTACHMENT FOR MONITORING FUEL CELL VOLTAGE

(71) Applicant: HYDROGENICS CORPORATION, Mississauga (CA)

(72) Inventor: Andrew Hill, Scarborough (CA)

(73) Assignee: HYDROGENICS CORPORATION, Mississauga (CA)

( * ) Notice: Subject to any disclaimer, the term of this patent is extended or adjusted under 35 U.S.C. 154(b) by 696 days.

(21) Appl. No.: 18/150,028

(22) Filed: Jan. 4, 2023

(65) Prior Publication Data

US 2023/0246209 A1     Aug. 3, 2023

Related U.S. Application Data

(60) Provisional application No. 63/300,938, filed on Jan. 19, 2022.

(51) Int. Cl.
| | |
|---|---|
| *H01M 8/04537* | (2016.01) |
| *G01R 31/36* | (2020.01) |
| *G01R 31/3835* | (2019.01) |
| *G01R 31/396* | (2019.01) |
| *H01B 7/00* | (2006.01) |
| *H01B 7/08* | (2006.01) |
| *H01M 8/0247* | (2016.01) |

(52) U.S. Cl.
CPC .... *H01M 8/04559* (2013.01); *G01R 31/3644* (2013.01); *G01R 31/3835* (2019.01); *G01R 31/396* (2019.01); *H01M 8/0247* (2013.01);

*H01B 7/009* (2013.01); *H01B 7/0823* (2013.01); *H01M 2250/20* (2013.01)

(58) Field of Classification Search
None
See application file for complete search history.

(56) References Cited

U.S. PATENT DOCUMENTS

| | | | | |
|---|---|---|---|---|
| 6,749,452 | B2 * | 6/2004 | Hortop | H01M 8/04537 |
| | | | | 439/260 |
| 7,682,714 | B2 | 3/2010 | Aoto et al. | |
| 9,692,190 | B2 | 6/2017 | Hood | |
| 9,997,792 | B2 * | 6/2018 | Karmazyn | H01M 8/242 |
| 10,024,927 | B2 | 7/2018 | Katano et al. | |
| 2002/0177019 | A1 * | 11/2002 | Aoto | H01M 8/0247 |
| | | | | 429/432 |
| 2009/0110991 | A1 * | 4/2009 | Peng | H01M 8/2483 |
| | | | | 429/514 |
| 2015/0155576 | A1 | 6/2015 | Jones | |
| 2015/0280261 | A1 * | 10/2015 | Horlock | H01M 8/1004 |
| | | | | 429/457 |
| 2020/0176792 | A1 * | 6/2020 | Munthe | H01M 8/0258 |

FOREIGN PATENT DOCUMENTS

| | | |
|---|---|---|
| JP | 2019021522 | 2/2019 |
| JP | 2020524382 | 8/2020 |

* cited by examiner

*Primary Examiner* — Kevin M Bernatz

(74) *Attorney, Agent, or Firm* — Barnes & Thornburg LLP

(57) ABSTRACT

The present disclosure relates to a glueless repeatable finger attachment apparatus and method of monitoring a fuel cell voltage comprising the same.

18 Claims, 9 Drawing Sheets

GLUELESS REPEATABLE FINGER ATTACHMENT FOR MONITORING FUEL CELL VOLTAGE

CROSS-REFERENCE TO RELATED APPLICATIONS

This nonprovisional application claims the benefit and priority, under 35 U.S.C. § 119 (e) and any other applicable laws or statutes, to U.S. Provisional Patent Application Ser. No. 63/300,938 filed on Jan. 19, 2022, the entire disclosure of which is hereby expressly incorporated herein by reference.

TECHNICAL FIELD

The present disclosure relates to a glueless repeatable finger attachment apparatus and method of monitoring a fuel cell voltage comprising the same.

BACKGROUND

A fuel cell system or stack typically comprises multiple fuel cells. A fuel cell is comprised of several alternating bipolar plates and membranes compressed together to form a stack. Once assembled, a fuel cell stack is typically checked or reviewed (e.g., quality control) in order to verify the proper assembly of the bipolar plates and membranes to ensure proper or optimal operational performance of each fuel cell.

For example, a cell voltage monitoring circuit board is a current way to measure the individual voltages of a fuel cell plate (e.g., a bipolar plate). Alternatively, the voltage on each individual cell plate may be reasonably approximated or calculated by measuring every other fuel cell or every third fuel cell, for example. Monitoring cell voltage output helps identify weak, malfunctioning, or problematic fuel cells.

Current monitoring circuit boards typically have a multitude of wires (e.g., fingers) that must be conductively bonded to each individual fuel cell plate in order to monitor the voltage of that fuel cell. For example, conventional fuel cell monitoring mechanisms comprise glue and/or adhesive to attach or adhere the fingers to the bipolar plates in order to facilitate cell voltage monitoring. Oftentimes, the glue or adhesive is conductive, and is used to attach each wired finger to the top of each fuel cell plate. However, there are several issues with the current approach of gluing fingers to the fuel cells.

First, glue or adhesive is unreliable. Problems or issues often arise from cell voltage monitoring fingers coming loose, detaching, and/or disconnecting from the fuel cell plates, which often leads to malfunction, faults, and/or alarms in the fuel cell. This is particularly true in systems where, for example, each cell is not monitored, such that there may not even be a voltage reading for any affected or faulty fuel cells.

Secondly, the process of gluing fingers to a fuel cell plate is extremely time consuming. Although it seems relatively easy, gluing fingers to fuel cell plates requires an elevated skill level. Each finger must be individually placed on the plate, often with tweezers or small instruments or equipment either manually or electronically. Special care must be taken that none of the glue overlaps onto an adjacent fuel cell causing a short circuit.

Moreover gluing, or attaching fingers to the fuel cell plate with an adhesive, is not an easily reversible process, if reversible at all. In the event that a fuel cell stack needs to be repaired, the fuel cell stack must be disassembled and a cell voltage monitoring system (CVM) printed circuit board (PCB) must be removed. Typically, such disassembly requires removing and/or ungluing all the fingers from the fuel cell plates, which is as tedious and time consuming as their assembly. Resumed or continued performance of the fuel cell in the stack often requires the surface of the cells to be cleaned sufficiently (e.g., of excess glue or debris) in order for new glue to properly adhere to the fuel cell plate when reinstalling cell voltage monitoring fingers.

In light of these deficiencies in current cell voltage monitoring (CVM) systems, there is a present need for an improved CVM mechanism that overcomes the challenges incurred by bonding cell voltage monitoring fingers to bipolar plates with glue or adhesive. Accordingly, the present apparatus, system, and/or method enables cell voltage monitoring of one or more fuel cell plates in a stack without the use of glue or adhesive.

SUMMARY

Embodiments of the present disclosure are included to meet these and other needs.

In one aspect of the present disclosure, described herein, a repeatable finger attachment to monitor voltage of a fuel cell stack comprises one or more wired fingers, and each of the one or more wired fingers has an isolation material and one or more electrical conductors. The isolation material is adapted to surround at least a first portion of the one or more electrical conductors to prevent electrical contact between at least the first portion of the one or more electrical conductors and the fuel cell stack. The one or more electrical conductors are adapted to be positioned in one or more alternating channels of the fuel cell stack to provide electrical contact between a second portion of the one or more electrical conductors and one or more bipolar plates of the fuel cell stack so that an electrochemical reaction is generated by the fuel cell stack to provide electrical power.

In some embodiments, the wired fingers or the conductors may comprise a self-alignment feature within the alternating channels. In some embodiments, the wired fingers may self-align in the one or more alternating channels between one or more tabs of the bipolar plates.

In some embodiments, each of the wired fingers may be attached to the one or more bipolar plates without glue or adhesive. In some embodiments, each of the wired fingers may be attached to the one or more bipolar plates on a front face or an alternate face of the fuel cell stack. In some embodiments, 100% of the voltage of the fuel cell stack may be simultaneously monitored by each of the wired fingers.

According to another aspect of the present disclosure, described herein, an alternating fuel cell assembly for monitoring fuel cell voltage in a fuel cell stack comprises one or more bipolar plates, a repeatable finger attachment, and a clamping bar. The one or more bipolar plates are stacked and alternately rotated to create one or more alternating channels. Each of the one or more bipolar plates further comprise a tab. The repeatable finger attachment has one or more wired fingers. Each of the wired fingers are attached to the one or more bipolar plates on a face glue or adhesive. The clamping bar securely fits into the tab of each of the one or more bipolar plates atop the one or more wired fingers to provide electrical contact between the wired fingers and the one or more bipolar plates.

In some embodiments, the bipolar plates may be alternately rotated about 90-270 degrees. In some embodiments, each of the wired fingers may comprise one or more electrical conductors and an isolation material. In some embodiments, the wired fingers or the conductors may comprise a self-alignment feature within the alternating channels between one or more tabs of the one or more bipolar plates. In some embodiments, the tab may provide electrical isolation between the one or more wired fingers and adjacent bipolar plates.

In some embodiments, the tab may comprise a notch. I the second aspect of the present invention, the notch may be tapered.

In some embodiments, the clamping bar may comprise a nonconductive material. In some embodiments, the clamping bar may provide a downward pressure on one or more wired fingers to make electrical contact between the one or more wired fingers and the one or more bipolar plates. In some embodiments, the clamping bar may be secured to the fuel cell stack at an endplate of the fuel cell stack.

In some embodiments, the clamping bar may be secured along the entire length of the fuel cell stack. In some embodiments, each of the one or more wired fingers may be attached to the one or more bipolar plates without glue or adhesive. In some embodiments, each of the one or more wired fingers may be attached to the one or more bipolar plates on a front face or an alternate face of the fuel cell stack. In some embodiments, 100% of cell voltage may be simultaneously monitored by utilizing each of the one or more wired fingers attached to the one or more bipolar plates in the one or more alternating channels on a front face and an alternate face of the fuel cell stack.

BRIEF DESCRIPTION OF THE DRAWINGS

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present disclosure is defined solely by the claims.

4

Figure 5:
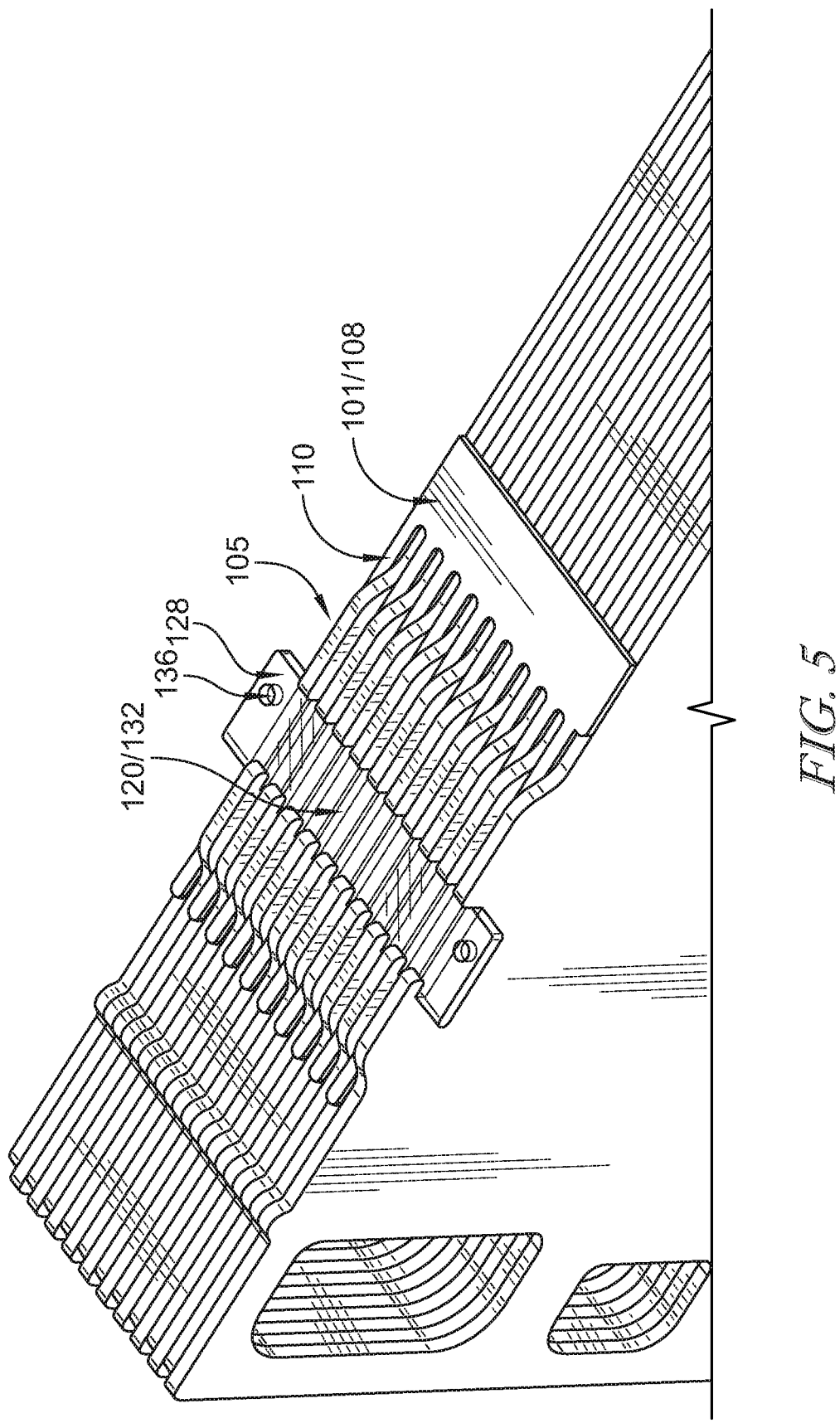
Figure 6:
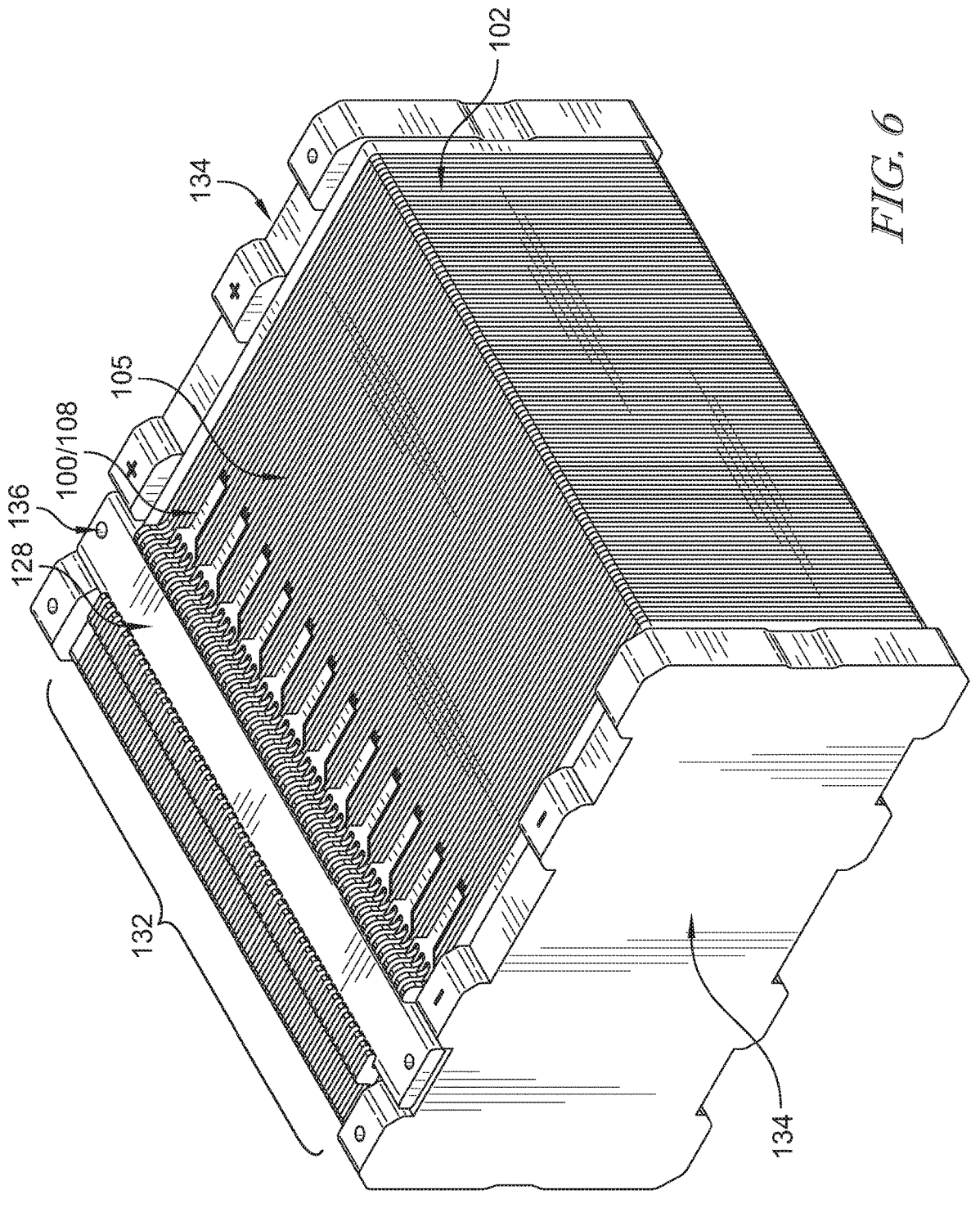
Figure 7:
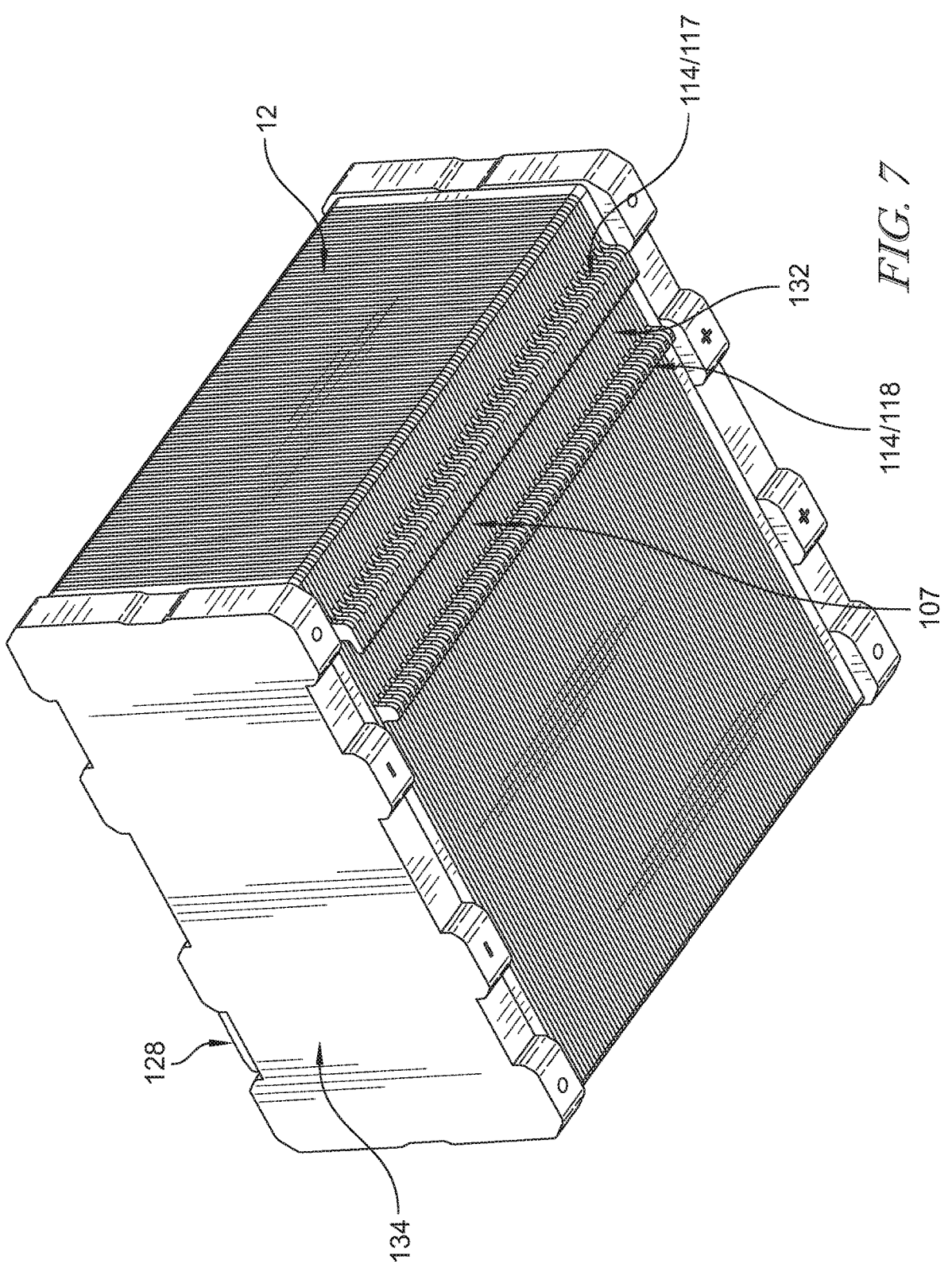

FIG. 5 shows a stack of fuel cell plates (e.g., bipolar plates) with a second embodiment of the present cell voltage monitoring finger attachment comprising the clamping bar that is not fastened to the endplates;

FIG. 6 shows a stack of fuel cell plates with multiple cell voltage monitoring finger attachments along with the clamping bar fastened to both endplates;

FIG. 7 shows the underside of the stack of fuel cells of FIG. 6, including the rotated positioning or orientation of the bipolar plates.

These and other features, aspects, and advantages of the present embodiments will become better understood when the following detailed description is read with reference to the accompanying drawings described herein.

DETAILED DESCRIPTION

The present disclosure is related to a repeatable finger attachment 101 for a fuel cell stack 12 for monitoring the voltage of a fuel cell stack 12. The present disclosure is also related to an alternating fuel cell assembly 200 for monitoring the voltage of a fuel cell stack 12. The present disclosure is further related to a method of monitoring fuel cell voltage of a fuel cell stack 12 or a fuel cell 20 using the repeatable finger attachment 101 and/or the alternating fuel cell assembly 200 described herein.

Figure 1A:
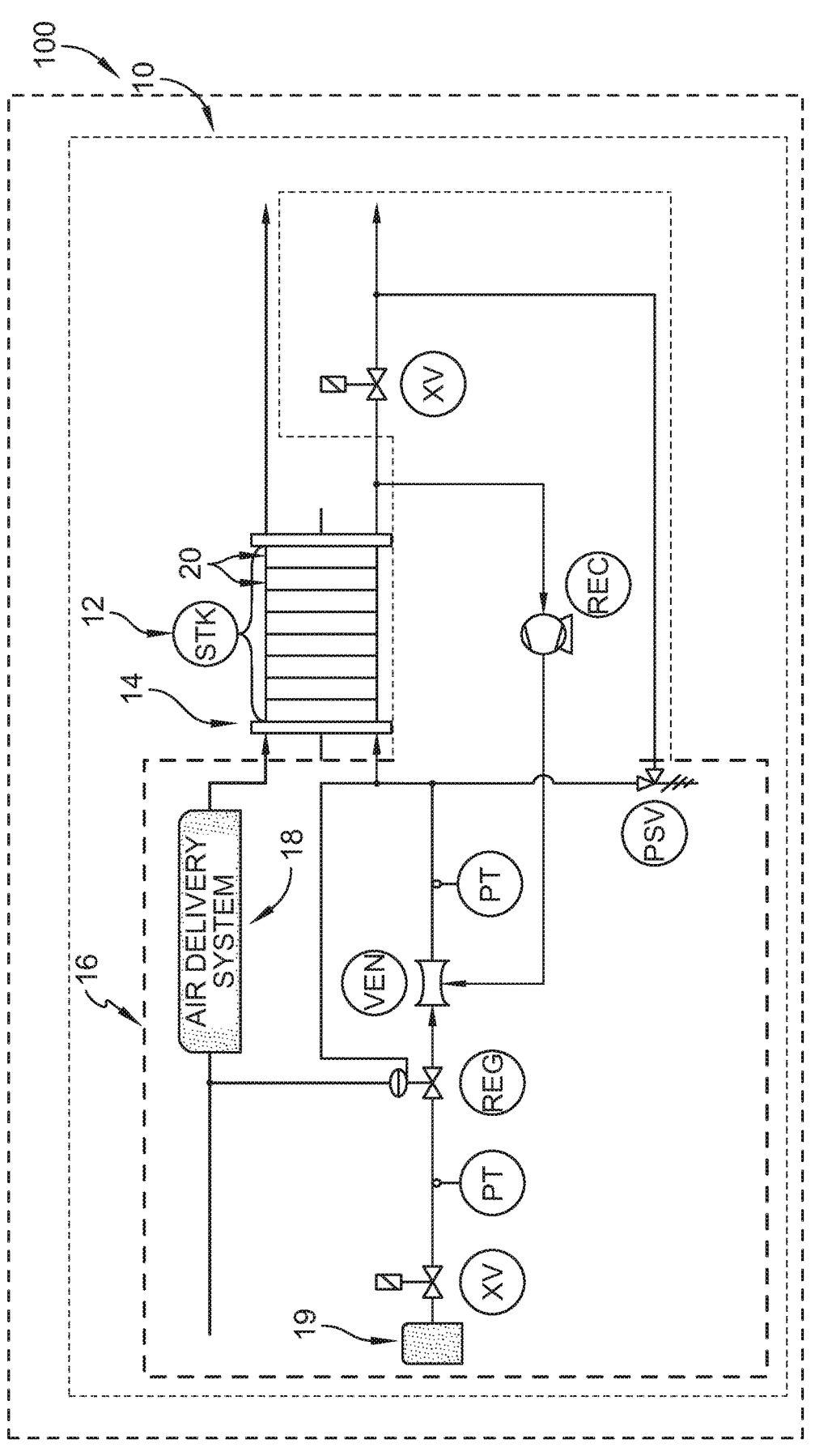
FIG. 1A is a schematic view of an exemplary fuel cell system including an air delivery system, a hydrogen delivery system, and a fuel cell module including a stack of multiple fuel cells.
Figures 1B, 1C:
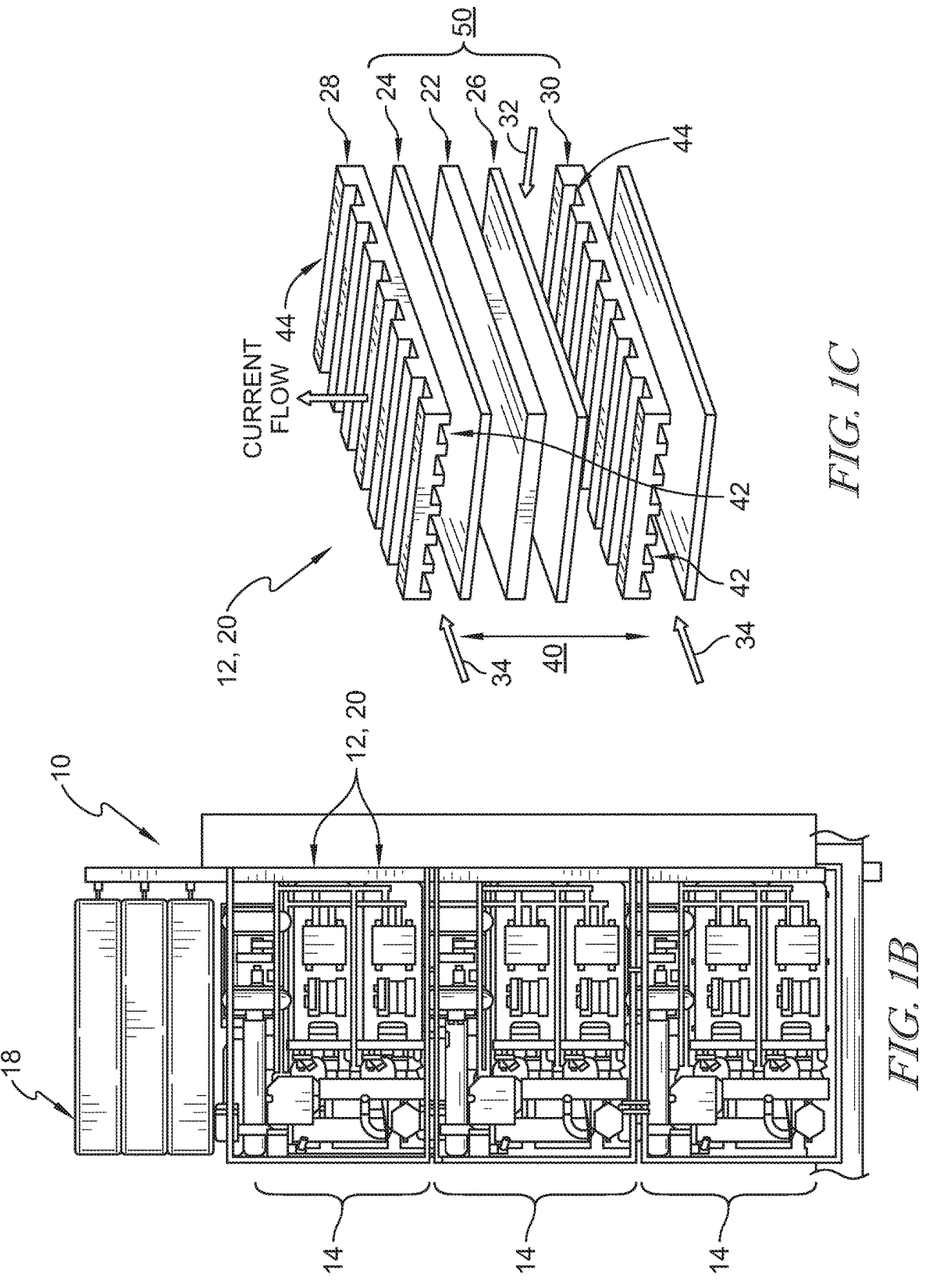
FIG. 1B is a cutaway view of an exemplary fuel cell system including an air delivery system, hydrogen delivery systems, and a plurality of fuel cell modules each including multiple fuel cell stacks.
FIG. 1C is a perspective view of an exemplary repeating unit of a fuel cell stack of the fuel cell system of FIG. 1A.

As shown in FIG. 1A, fuel cell systems 10 often include one or more fuel cell stacks 12 or fuel cell modules 14 connected to a balance of plant (BOP) 16, including various components, to support the electrochemical conversion, generation, and/or distribution of electrical power to help meet modern day industrial and commercial needs in an environmentally friendly way. As shown in FIGS. 1B and 1C, fuel cell systems 10 may include fuel cell stacks 12 comprising a plurality of individual fuel cells 20. Each fuel cell stack 12 may house a plurality of fuel cells 20 assembled together in series and/or in parallel. The fuel cell system 10 may include one or more fuel cell modules 14 as shown in FIGS. 1A and 1B.

Each fuel cell module 14 may include a plurality of fuel cell stacks 12 and/or a plurality of fuel cells 20. The fuel cell module 14 may also include a suitable combination of associated structural elements, mechanical systems, hardware, firmware, and/or software that is employed to support the function and operation of the fuel cell module 14. Such items include, without limitation, piping, sensors, regulators, current collectors, seals and insulators.

The fuel cells 20 in the fuel cell stacks 12 may be stacked together to multiply and increase the voltage output of a single fuel cell stack 12. The number of fuel cell stacks 12 in a fuel cell system 10 can vary depending on the amount of power required to operate the fuel cell system 10 and meet the power need of any load. The number of fuel cells 20 in a fuel cell stack 12 can vary depending on the amount of power required to operate the fuel cell system 10 including the fuel cell stacks 12.

The number of fuel cells 20 in each fuel cell stack 12 or fuel cell system 10 can be any number. For example, the number of fuel cells 20 in each fuel cell stack 12 may range from about 100 fuel cells to about 1000 fuel cells, including any specific number or range of number of fuel cells 20 comprised therein (e.g., about 200 to about 800). In an embodiment, the fuel cell system 10 may include about 20 to about 1000 fuel cells stacks 12, including any specific number or range of number of fuel cell stacks 12 comprised therein (e.g., about 200 to about 800). The fuel cells 20 in the fuel cell stacks 12 within the fuel cell module 14 may be oriented in any direction to optimize the operational efficiency and functionality of the fuel cell system 10.

The fuel cells 20 in the fuel cell stacks 12 may be any type of fuel cell 20. The fuel cell 20 may be a polymer electrolyte membrane or proton exchange membrane (PEM) fuel cell, an anion exchange membrane fuel cell (AEMFC), an alkaline fuel cell (AFC), a molten carbonate fuel cell (MCFC), a direct methanol fuel cell (DMFC), a regenerative fuel cell (RFC), a phosphoric acid fuel cell (PAFC), or a solid oxide fuel cell (SOFC). In an exemplary embodiment, the fuel cells 20 may be a polymer electrolyte membrane or proton exchange membrane (PEM) fuel cell or a solid oxide fuel cell (SOFC).

In an embodiment shown in FIG. 1C, the fuel cell stack 12 includes a plurality of proton exchange membrane (PEM) fuel cells 20. Each fuel cell 20 includes a single membrane electrode assembly (MEA) 22 and a gas diffusion layers (GDL) 24, 26 on either or both sides of the membrane electrode assembly (MEA) 22 (see FIG. 1C). The fuel cell 20 further includes a bipolar plate (BPP) 28, 30 on the external side of each gas diffusion layers (GDL) 24, 26, as shown in FIG. 1C. The above-mentioned components, in particular the bipolar plate 30, the gas diffusion layer (GDL) 26, the membrane electrode assembly (MEA) 22, and the gas diffusion layer (GDL) 24 comprise a single repeating unit 50.

The bipolar plates (BPP) 28, 30 are responsible for the transport of reactants, such as fuel 32 (e.g., hydrogen) or oxidant 34 (e.g., oxygen, air), and cooling fluid 36 (e.g., coolant and/or water) in a fuel cell 20. The bipolar plates (BPP) 28, 30 can uniformly distribute reactants 32, 34 to an active area 40 of each fuel cell 20 through oxidant flow fields 42 and/or fuel flow fields 44 formed on outer surfaces of the bipolar plates (BPP) 28, 30. The active area 40, where the electrochemical reactions occur to generate electrical power produced by the fuel cell 20, is centered, when viewing the stack 12 from a top-down perspective, within the membrane electrode assembly (MEA) 22, the gas diffusion layers (GDL) 24, 26, and the bipolar plate (BPP) 28, 30.

Figure 1D:
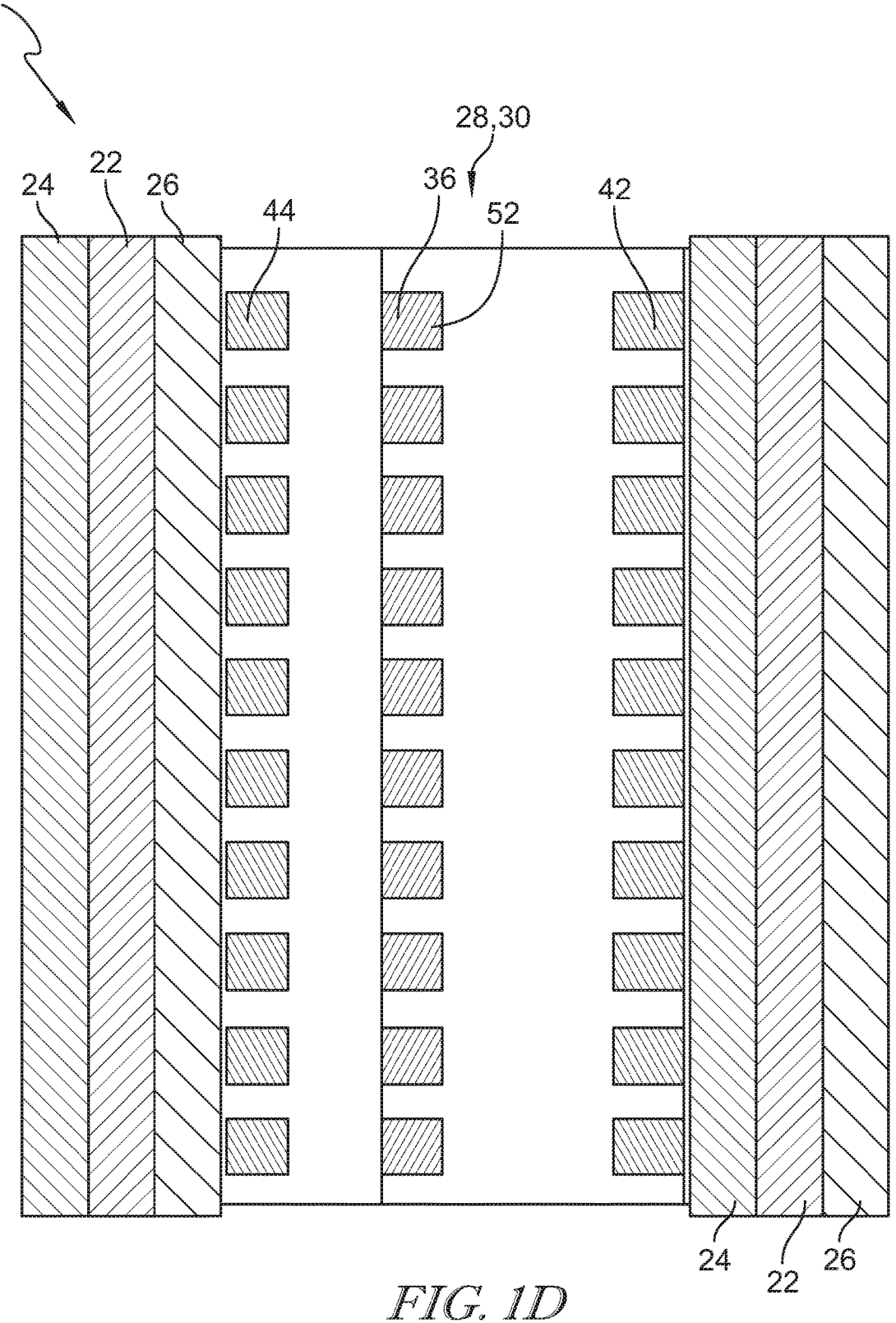
FIG. 1D is a cross-sectional view of an exemplary repeating unit of the fuel cell stack of FIG. 1C.

The bipolar plates (BPP) 28, 30 may each be formed to have reactant flow fields 42, 44 formed on opposing outer surfaces of the bipolar plate (BPP) 28, 30, and formed to have coolant flow fields 52 located within the bipolar plate (BPP) 28, 30, as shown in FIG. 1D. For example, the bipolar plate (BPP) 28, 30 can include fuel flow fields 44 for transfer of fuel 32 on one side of the plate 28, 30 for interaction with the gas diffusion layer (GDL) 26, and oxidant flow fields 42 for transfer of oxidant 34 on the second, opposite side of the plate 28, 30 for interaction with the gas diffusion layer (GDL) 24. As shown in FIG. 1D, the bipolar plates (BPP) 28, 30 can further include coolant flow fields 52 formed within the plate (BPP) 28, 30, generally centrally between the opposing outer surfaces of the plate (BPP) 28, 30. The coolant flow fields 52 facilitate the flow of cooling fluid 36 through the bipolar plate (BPP) 28, 30 in order to regulate the temperature of the plate (BPP) 28, 30 materials and the reactants. The bipolar plates (BPP) 28, 30 are compressed against adjacent gas diffusion layers (GDL) 24, 26 to isolate and/or seal one or more reactants 32, 34 within their respective pathways 44, 42 to maintain electrical conductivity, which is required for robust operation of the fuel cell 20 (see FIGS. 1C and 1D).

The fuel cell system 10 described herein, may be used in stationary and/or immovable power system, such as industrial applications and power generation plants. The fuel cell system 10 may also be implemented in conjunction with an air delivery system 18. Additionally, the fuel cell system 10 may also be implemented in conjunction with a hydrogen delivery system and/or a source of hydrogen 19 such as a pressurized tank, including a gaseous pressurized tank, cryogenic liquid storage tank, chemical storage, physical storage, stationary storage, an electrolysis system or an electrolyzer. In one embodiment, the fuel cell system 10 is connected and/or attached in series or parallel to a hydrogen delivery system and/or a source of hydrogen 19, such as one or more hydrogen delivery systems and/or sources of hydrogen 19 in the BOP 16 (see FIG. 1A). In another embodiment, the fuel cell system 10 is not connected and/or attached in series or parallel to a hydrogen delivery system and/or a source of hydrogen 19.

The present fuel cell system 10 may also be comprised in mobile applications. In an exemplary embodiment, the fuel cell system 10 is in a vehicle and/or a powertrain 100. A vehicle 100 comprising the present fuel cell system 10 may be an automobile, a pass car, a bus, a truck, a train, a locomotive, an aircraft, a light duty vehicle, a medium duty vehicle, or a heavy-duty vehicle. Type of vehicles 100 can also include, but are not limited to commercial vehicles and engines, trains, trolleys, trams, planes, buses, ships, boats, and other known vehicles, as well as other machinery and/or manufacturing devices, equipment, installations, among others.

The vehicle and/or a powertrain 100 may be used on roadways, highways, railways, airways, and/or waterways. The vehicle 100 may be used in applications including but not limited to off highway transit, bobtails, and/or mining equipment. For example, an exemplary embodiment of mining equipment vehicle 100 is a mining truck or a mine haul truck.

In addition, it may be appreciated by a person of ordinary skill in the art that the fuel cell system 10, fuel cell stack 12, and/or fuel cell 20 described in the present disclosure may be substituted for any electrochemical system, such as an electrolysis system (e.g., an electrolyzer), an electrolyzer stack, and/or an electrolyzer cell (EC), respectively. As such, in some embodiments, the features and aspects described and taught in the present disclosure regarding the fuel cell system 10, stack 12, or cell 20 also relate to an electrolyzer, an electrolyzer stack, and/or an electrolyzer cell (EC). In further embodiments, the features and aspects described or taught in the present disclosure do not relate, and are therefore distinguishable from, those of an electrolyzer, an electrolyzer stack, and/or an electrolyzer cell (EC).

As previously described, fuel cell stacks 12 and/or systems 10 typically comprise a plurality of fuel cells 20 stacked together to generate power. Fuel cells 20 generate power based on an electrochemical reaction that occurs between the hydrogen in fuel 32 at the anode (not shown) of the fuel cell and the oxidant (e.g., oxygen) in air 34 at the cathode (not shown) of the fuel cell 20. The amount of power generated by a fuel cell stack 12 is dependent on the number, power output, and proper performance and functionality of each fuel cell 20 comprised in the stack 12.

Fuel cells 20, fuel cell stacks 12 and/or fuel cell systems 10 comprised by the present disclosure, including but are not limited to proton exchange membrane fuel cells (PEMFCs) 20. Other common types of fuel cells 20 of the present disclosure include phosphoric acid fuel cells (PAFCs) 20, molten carbonate fuel cells (MCFCs) 20, and/or solid oxide fuel cells (SOFCs) 20, all generally named after their respective electrolytes. Many of these types of fuel cells 20 and systems 10 are useful for powering smaller portable applications, such as cars, trucks, industrial equipment, and/or other types of vehicles 100 and powertrains 100. An exemplary fuel cell 20 or fuel cell system 12 of the present apparatus 101, assembly system 200, and/or method 300 is a PEMFC 20.

A fuel cell 20 is a multicomponent assembly that often comprises a membrane electrode assembly (MEA) 22 at the center, a gas diffusion layer (GDL) 24, 26 on either side of the membrane electrode assembly (MEA) 22, and a bipolar plate (BPP) 28, 30 on either side of the gas diffusion layer (GDL) 24,26 (as previously described). The bipolar plate (BPP) 28, 30 typically comprises strong, rigid, and/or firm materials that may or may not be electrically conductive. An exemplary BPP 28, 30 of the present disclosure comprises a material that comprises or is graphite. For example, the BPP 28, 30 may comprise about 5% to about 100% graphite, including any specific or range of amount comprised therein including from about 5% to about 95%, from about 10% to about 85%, from about 25% to about 75%, from about 50% to about 100%, from about 55% to about 95%, from about 60% to about 100%, and otherwise.

The membrane electrode assembly (MEA) 22 is the component that enables electrochemical reactions in the fuel cell 20 and/or fuel cell stack 12. A typical fuel cell stack 12 is comprised of many fuel cell 20 assemblies compressed and bound into a fuel cell stack 12, wherein the compression is necessary to ensure proper connection between the fuel cell components (e.g. the GDL 24,26, MEA 22, and BPP 28,30)

A fuel cell 20 and/or fuel cell stack 12 is assembled in a layered fashion with the aforementioned components (e.g. the GDL 24,26, MEA 22, and BPP 28,30) to operate in a useful and reliable manner. In particular, one or more, multiple (i.e., more than 2), or a plurality (i.e., more than 3) of fuel cell bipolar plates 28, 30 may be directionally aligned in a similar or a same orientation, and stacked atop and/or beside one another to create the fuel cell stack 12. When the bipolar plates 28, 30 of the fuel cell stack 12 are directionally aligned and/or stacked in the same orientation, alternating channels 103 may not be created.

Figure 3:
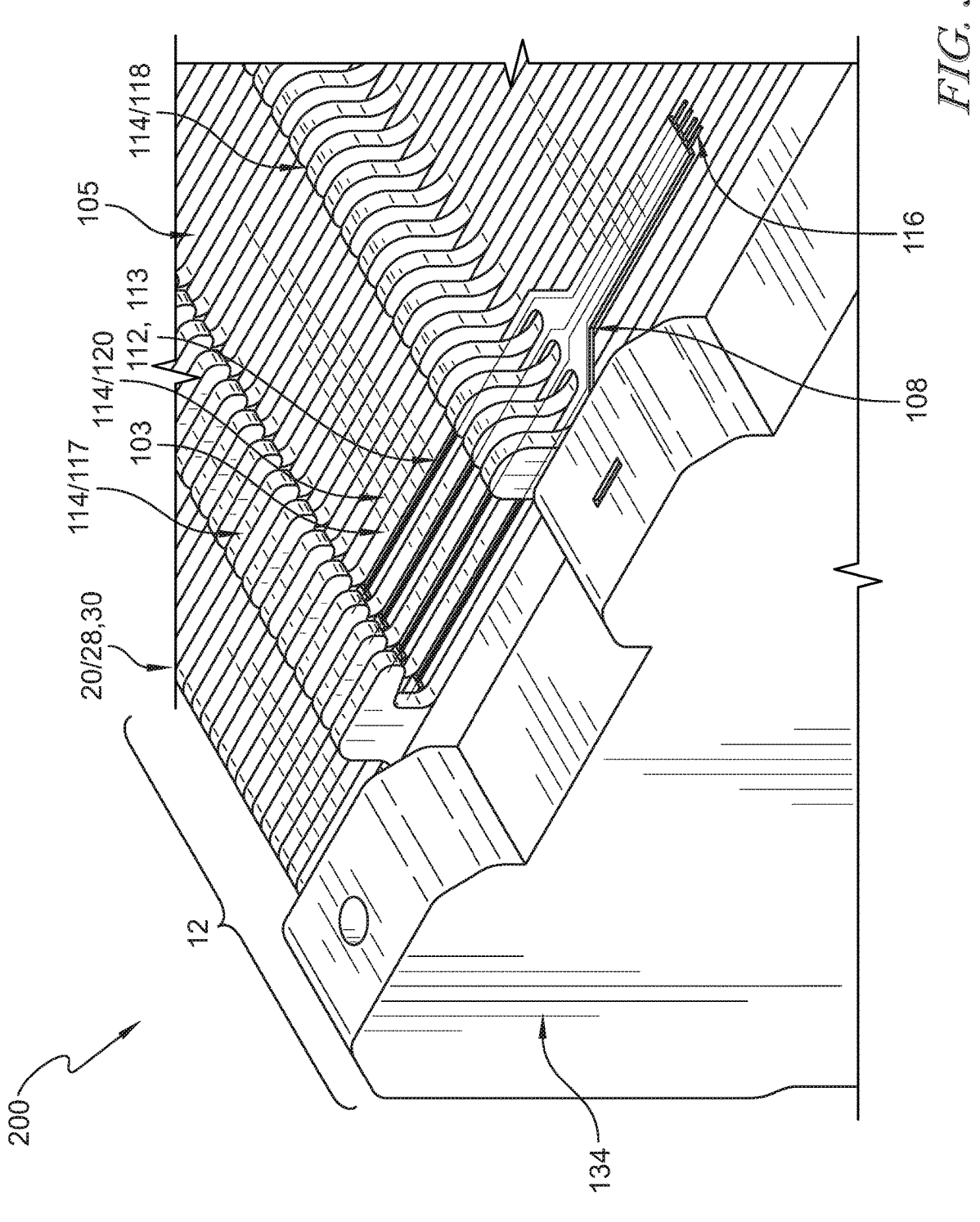
FIG. 3 shows a stack of fuel cell plates (e.g., bipolar plate) with one of the cell voltage monitoring finger attachments of FIG. 2B.

Accordingly, an exemplary embodiment of the present fuel cell stack 12 comprises bipolar plates 28, 30 that are not directionally aligned and/or in the same orientation (see FIG. 3). More specifically, the present fuel cell stack 12 comprises one or more, multiple (i.e., more than 2), or a plurality (i.e., more than 3) of fuel cell bipolar plates 28, 30 that are stacked and alternately rotated. In one embodiment, the BPPs 28, 30 of the fuel cell stack 12 may be alternately rotated, such that every other plate 28, 30 is oriented in the similar or the same direction that is a different orientation or direction than an adjacent plate 28, 30. In an exemplary embodiment, one or more bipolar plates 28, 30 are alternately rotated approximately 90 degrees (°) to about 320 degrees (°), including any specific or range of angle of degrees comprised therein (e.g., about 90 to about 270 degrees).

In an exemplary embodiment of FIG. 3, plates 28, 30 may be alternately rotated about 180 degrees. For example, a first set of alternating plates 28, 30 in the fuel cell stack 12 are oriented in the same first direction and a second set of alternating plates 28, 30 are oriented in a second direction that is rotated about 180 degrees from the orientation of the first direction of the first set of alternating plates 28, 30. In such an embodiment, the bipolar plates 28, 30 are alternately rotated about 180 degrees, such that the plates 28, 30 are only oriented in two different directions.

In other embodiments, alternating plates 28, 30 can be oriented in more than two different directions. For example, alternating plates 28, 30 could be oriented in three, four, or more different directions. However, in all embodiments where the bipolar plates 28, 30 are alternately rotated such that every other plate 28, 30 is oriented in a different direction as its adjacent plate 28, 30, an alternating channel 103 will be created.

For example, during a manufacturing and/or production process, the bipolar plates 28, 30 may be assembled such that they are sequentially (e.g., alternately) flipped and/or rotated. In doing so, an anode side (not shown) of one fuel cell 20 or plate 28, 30 contacts a cathode side (not shown) of an adjacent plate 28, 30, which will provide the alternating channels 103 for the monitoring fingers 108 or conductors 112 of the repeatable finger attachment 101 to be naturally seated or located in a position of contact on every other plate 28, 30. The design of the membrane (MEA) 22 may also be modified to have a tab 114 feature in order to provide electrical isolation of the conductors 112 of the attachment 101 and/or wired fingers 108 from the adjacent plates 28, 30.

Alternating channels 103 of the bipolar plates 28, 30 are configured in a way that the monitoring fingers 108 and/or conductors 112 have the ability to be placed (e.g., manually, mechanically, and/or automatedly) and/or to naturally position or seat themselves on specific plates 28, 30 (e.g., every other plate) within the channels 103. For example, the monitoring fingers 108 and/or conductors 112 may be sized to fit into the channels. Therefore, the conductors 112 of the attachment 101 and assembly 200 are understood to be self-aligning. In other words, the monitoring fingers 108 and/or conductors 112 have a self-aligning or self-alignment feature within the alternating channels 103. This self-alignment feature of the conductors 112 within the alternating channels 103 contributes to the overall improved electrical contact between the conductors 112 and the plates 28, 30.

Notably, alternating channels 103 will be created on a face 105, 107 of the fuel cell stack 12 comprising bipolar plates 28, 30 that are alternately rotated (see FIGS. 3 and 5-7). Fuel cell stacks 12 that have bipolar plates 28, 30 alternated in two directions will have two faces 105, 107, a first face 105 and a second face 107 comprising the alternating channels 103. The first face 105 may be a front face 105 of the fuel cell stack 12, while the second face 107 may be an alternate face 107 of the fuel cell stack 12, both comprising alternating channels 103. Similarly, fuel cell stacks 12 that have bipolar plates 28, 30 alternated in three, four, or more directions will have three, four, or more faces (e.g., a first 105, a second 107, a third, and/or a fourth face), respectively, to which conductors 112 of wired fingers 108 or a repeatable finger attachment 101 is in contact. In an exemplary embodiment, the fuel cell stack 12 comprises at least two faces 105, 107 (see FIGS. 6 and 7).

Referring back to FIG. 2A, in the present fuel cell stack 12 embodiment, a repeatable finger attachment 101 may engage with the one or more faces 105 of the bipolar plates (BPP) 28, 30 at the alternating channels 103. As shown in FIG. 5, a repeatable finger apparatus 101 of the present disclosure comprises one or more wired fingers 108. A wired finger 108 of the present apparatus 101 may comprise an isolation material 110 and/or one or more bare electrical conductors 112 ("conductors"; see FIGS. 2A and 3). The isolation material 110 is provided to protect or isolate one or more portions of the full extent of the one or more electrical conductors 112 from electrical reaction.

The isolation material 110 may be placed anywhere on the bare electrical conductors 112 or the wired fingers 108 of the repeatable finger apparatus 101. For example, the isolation material 110 may be placed on the proximal end of the wired finger 108, such as on the tip of the electrical conductors 112. Additionally or alternatively, the isolation material 110 may be placed on the distal end of the wired finger 108, or anywhere or in in between the two ends of the wired finger 108 (see FIGS. 2A and 2B).

A repeatable finger apparatus 101 and a wired finger 108 may comprise at least one, one or more, more than one, two or more, more than two, three or more, more than 3, four or more, or more than 4 electrical conductors 112. A repeatable finger apparatus 101 may comprise more than one bare electrical conductor 112 in any number or amount (e.g., about 1 to about 5000, including any specific or range comprised therein) and/or in any numeric multiple. For example, an embodiment of a repeatable finger apparatus 101 and/or wired finger 108 may comprise electrical conductors 112 in multiples of 2 (e.g., 2, 4, 6, 8), in multiples of 3 (e.g., 3, 6, 9, 12), in multiples of 4 (e.g., 4, 8, 12, 16), in multiples of 5 (e.g., 5, 10, 15 20), and beyond. An exemplary embodiment of the present repeatable finger attachment 101 comprises one or more wired fingers 108 having more than one bare electrical conductor 112 in amounts or numbers comprising even multiples (e.g., 2 conductors, 4 conductors, 6 conductors, 8 conductors, 10 conductors, 12 conductors, etc.). An exemplary embodiment of a repeatable finger apparatus 101 and a wired finger 108 comprising 4 conductors 112 is shown in FIGS. 2A and 3.

Figures 2A, 2B:
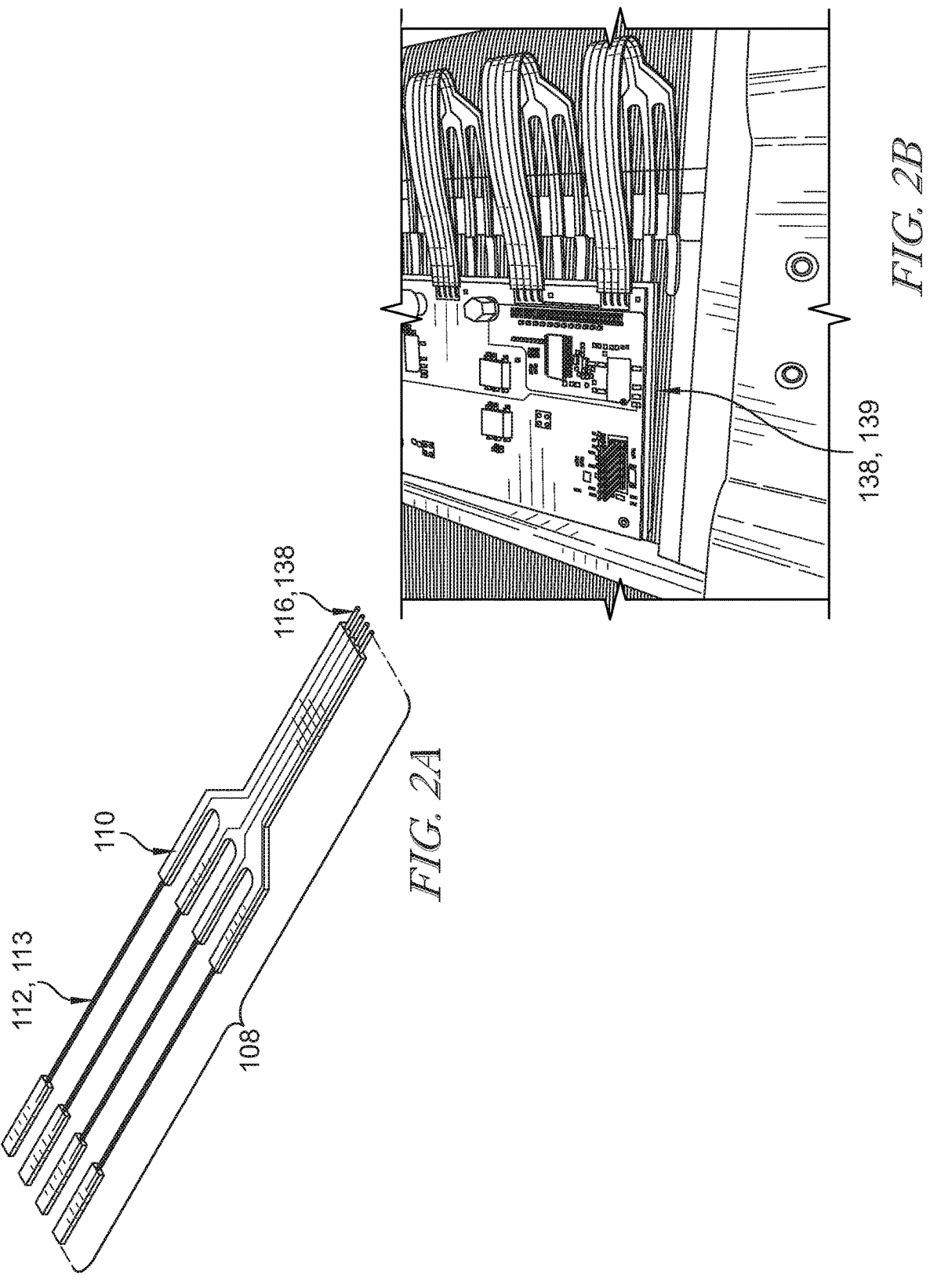
FIG. 2A shows one embodiment of a cell voltage monitoring finger attachment comprising wired fingers of the present disclosure.
FIG. 2B is an image of one embodiment of a current cell voltage monitoring printed circuit board (PCB) with fingers.

An exemplary bare electrical conductor 112 of the wired fingers 108 or attachment 101 is a wire 112 (see FIG. 2A). Electrically conductive wire 112 or any other electrically conductive material are typically sufficient to serve as an electrical conductor 112 of the present apparatus 101. The conductors 112 of the repeatable finger attachment 101 and wired fingers 108 also form a point of attachment 116 to a cell voltage monitoring (CVM) printed circuit board (PCB) 138 (see FIG. 2B).

The electrically conductive wires 112 may be made of any material. Exemplary materials of the wires 112 are conductive materials, such as metal (e.g., copper). The conductive wires 112 may also comprise a coating 113. This coating 113 may be a conductive coating 113 to prevent corrosion, rust, and/or deterioration of the bare electrical conductor 112.

The cell voltage monitoring (CVM) printed circuit board (PCB) 138 is responsible for monitoring, measuring, recording, determining, and/or transmitting the cell voltage of the one of more fuel cells 20 or fuel cell stacks 12 (see FIG. 2B). For example, the fuel cell voltage may be measured, detected, and/or collected as a fuel cell voltage measurement data at the fuel cell system 10 or fuel cell stacks 12 (see FIG. 2B) and transmitted to another component, such as a controller 139. The fuel cell voltage measurement data may be transmitted automatically, immediately, electronically, in real-time, periodically, regularly, continuously, and/or consistently from the PCB 138 to the controller 139, which is responsible for altering the fuel cell power output accordingly.

The controller 139 may be implemented, in communication with hardware, firmware, software, or any combination thereof present on or outside the fuel cell system 10 comprising the repeatable finger apparatus 101. Information may be transferred to the one or more controllers using any one or more communication technology (e.g., wired or wireless communications) and associated protocols (e.g., Ethernet, InfiniBand®), Wi-Fi®, Bluetooth®, WiMAX, 3G, 4G LTE, 5G, etc.) to effect such communication.

The controller 139 may be in a computing device. The computing device may be embodied as any type of computation or computer device capable of performing the functions described herein, including, but not limited to, a server (e.g., stand-alone, rack-mounted, blade, etc.), a network appliance (e.g., physical or virtual), a high-performance computing device, a web appliance, a distributed computing system, a computer, a processor-based system, a multiprocessor system, a smartphone, a tablet computer, a laptop computer, a notebook computer, and a mobile computing device.

The computing device may include an input/output (I/O) subsystem, a memory, a processor, a data storage device, a communication subsystem, a controller, and a display. The computing device may include additional and/or alternative components, such as those commonly found in a computer (e.g., various input/output devices), in other embodiments. In other embodiments, one or more of the illustrative components may be incorporated in, or otherwise form a portion of, another component. For example, the memory, or portions thereof, may be incorporated in the processor.

Output fuel cell voltage measurement data of the present monitoring attachment 101, system 10, assembly 200, and/or method 300 that indicate or are analyzed by the controller to indicate one or more deviations, faults, errors, shorts, and/or any other type of operational and/or functional error that may trigger recovery and/or repair mechanisms within the controller or a control program. Alternatively, such erroneous, problematic, or troublesome fuel cell voltage measurement data or readings may indicate (e.g., alarm or notification) the need for the controller to execute, implement, start, stop, and/or modify the fuel cell stack repair or operations.

As shown in FIG. 3, the repeatable finger attachment 101 comprising one or more wired fingers 108 may engage with one or more bipolar plates (BPP) 28, 30 of the fuel cell stack 12. Importantly, the repeatable finger attachment 101 comprising one or more wired fingers 108 may be configured to contact, attach, adhere, and/or connect to the bipolar plates (BPP) 28, 30 of the fuel cell stack 12. Connection between the conductors 112 of the wired fingers 108 of the repeatable finger attachment 101 and the bipolar plates 28, 30 should be direct and/or secure to ensure an electrochemical reaction is generated by the fuel cell 20 resulting in electrical power. The conductors 112 enable optimal electrical power generation and/or the electrochemical reaction leading to electrical power generated by the fuel cell.

Fuel cell bipolar plates 28, 30 may be manufactured to comprise one or more features to help promote the electrochemical reaction generated by the fuel cell 20. Preferably, each bipolar plate 28, 30 is manufactured or produced to comprise a tab 114. Alternatively, a tab 114 or other features could be manually and/or mechanically added to a standard commercial bipolar plate aftermarket (see FIGS. 3, 4A, and 4B).

The tab 114 comprises one or more raised parts 117, 118, 120, or portions of the BPP 28, 30. Specifically, the tab 114 comprises one or more component parts 117, 118, 120 ("components") that rise above the larger flat plane of the bipolar plate. While the tab 114 may have any shape or geometry of any size, the present tab 114 embodiment has a specific hook-shaped geometry design that provides advantages to enhance fuel cell operation and performance.

Figures 4A, 4B:
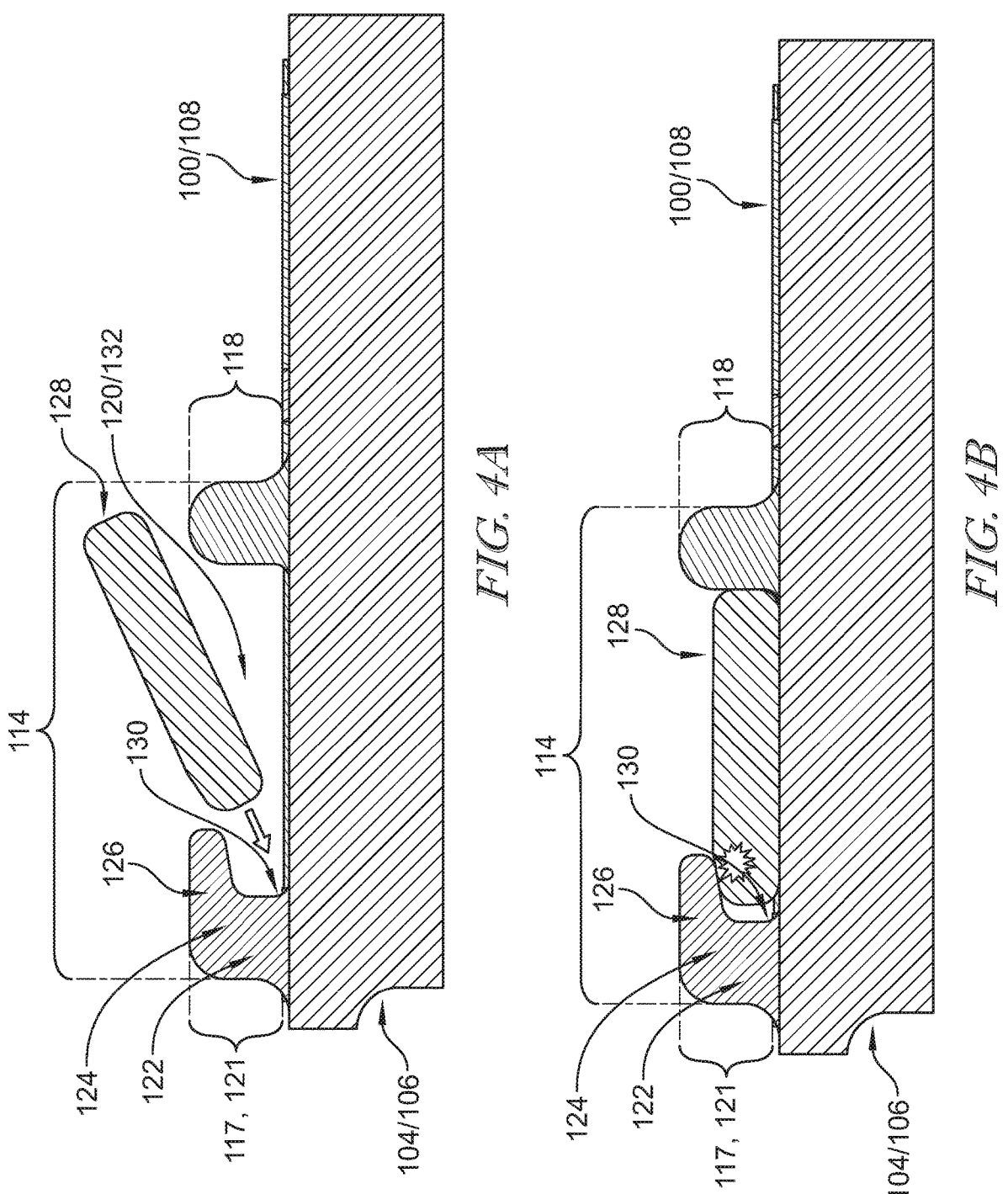
FIG. 4A shows a notch of a bipolar plate with a clamping bar being positioned within the notch.
FIG. 4B shows the notch of FIG. 4A with a clamping bar firmly positioned within the notch to apply pressure on the cell voltage monitoring fingers of the attachment.

Referring now to FIGS. 3-4B, in one embodiment, the tab 114 comprises three separate parts or portions, a hooked stop 117, a main stop 118, and a notch 120. The hooked stop 117 and the main stop 118 are raised outer portions of the tab 114 that are formed from and comprised by the flat plane of the bipolar plate 28, 30. In an exemplary embodiment of the tab 114, the hooked stop 117 and the main stop 118 are located on opposite or opposing ends of the tab 114 with the notch 120 comprised therebetween.

In one embodiment, the hooked stop 117 may be on the left side of the tab 114, while the main stop 118 is on the right side of the tab 114 (see FIGS. 3-7). In another embodiment, the hooked stop 117 may be on the right side of the tab 114, while the main stop 118 is on the left side of the tab 114. In all embodiments, the notch 120 is located between the hooked stop 117 and the main stop 118.

The hooked stop 117 and the main stop 118 provide a raised portion of the bipolar plate 28, 30, respectively. In doing so, the hooked stop 117 and the main stop 118 provide a physical barrier and/or resistive structural force as an improved and unique feature to standard commercial bipolar plates 28, 30. For example, the tab 114 comprising the hooked stop 117 and the main stop 118 prevent an object from moving or sliding beyond the stops 117, 118 within the notch 120.

Typically, the hooked stop 117 and the main stop 118 will have the same or similar heights above the flat plane of one or more bipolar plates 28, 30. For example, the hooked stop 117 and the main stop 118 shown in FIGS. 3-4B may have a height 121 above the flat plane of the bipolar plates 28, 30 that ranges from about 5 mm to about 30 mm, including any specific or ranges of heights comprised therein. For example, an exemplary height 121 of the stops 117, 118 would be about 15 mm. However, in some embodiments, the hooked stop 117 and the main stop 118 do not have the same height.

The hooked stop 117 and the main stop 118 will typically have the same or similar widths from each other on the one or more bipolar plates 28, 30. For example, the hooked stop 117 and the main stop 118 shown in FIGS. 3-4B may have a width apart that ranges from about 1 mm to about 10 mm, including any specific or ranges of width comprised therein. An exemplary width of the stops 117, 118 may range from about 1.5 mm to about 4 mm, including any specific or ranges of width comprised therein. Generally, the length and/or width between the stops 117, 118 defines an area of space comprised by the notch 120 (e.g., a notch space). The uniformity of the width between the hooked stop 117 and the main stop 118 is important to ensure that the notch 120 area is similarly and evenly spaced and positioned on each bipolar plate 28, 30 along the full fuel cell stack 12.

Referring to FIGS. 4A and 4B, the design of the hooked stop 117 of the present assembly 200 is important. Specifically, the hooked stop 117 of the tab 114 comprises a base stop portion 122 and an upper hook portion 124. The base stop portion 122 of the hooked stop 117 is physically and functionally similar to the main stop 118 that connects to the bipolar plate 28, 30 and provides a barrier on the outer periphery of the notch 120. The base stop portion 122 and the main stop 118 work together to provide constraint on the width and/or height of the notch 120 area.

The base stop portion 122 is typically manufactured to include the upper hook portion 124 of the hooked stop 117. The upper hook portion 124 and/or the base stop portion 122 of the hooked stop 117 are shaped to comprise the notch 120. Specifically, the upper hook portion 124 of the hooked stop 117 comprises a hook feature 126 ("hook") that extends beyond the width of the base stop portion 122 into the notch 120. For example, the hook 126 of the upper hook portion 124 of the hooked stop 117 may extend a distance ranging from about 5 mm to about 25 mm beyond the inner end 130 of the base stop portion 122 of the hooked stop 117, including any specific distance or range of distance comprised therein. In exemplary embodiments, the hook 126 may extend about 10 mm from the inner end/wall 130 of the base stop portion 122 of the hooked stop 117 into the notch 120.

As shown in FIGS. 4A and 4B, this hook 126 extends into the notch 120 to create an upper barrier 126 and/or a resistive structural force on the height and/or positioning of the notch 120, and particularly objects placed therein. Further, this hook 126 extends into the notch 120 to create a tapered notch 132. The physical constraints (e.g. height and width) of the notch 120 or tapered notch 132 require that an object inserted into the notch 120 is first positioned under the hook 126 of the upper hook portion 124, and within the opposing barriers of the base stop portion 122 of the hooked stop 117 and the main stop 118, as shown in FIG. 4B.

An exemplary embodiment of the present alternating fuel cell assembly 200 includes a fuel cell stack 12 that has alternating bipolar plates 28, 30, alternating channels 103, and an extended notch 132. The extended notch (e.g., tapered notch) 132 is created by the alignment of each notch 120 or tapered notch 132 on the one or more alternating plates 28, 30 in the stack 12. Preferably, the alternating channels 103 are positioned on the fuel cell stack 12 in a direction that is different from and/or not the same as the direction of the notches 120 or extended notches 132. Assembly 200 embodiments may comprise alternating channels 103 and notches 120 or extended notches 132 that are oriented at least with 90 degrees of separation. For example, in some embodiments, alternating channels 103 may be positioned in a perpendicular orientation as compared to the direction of the notches 120 or extended notches 132. This crossfunctional design is key to enable the repeatable finger attachment 101 and/or the wired fingers 108 to lie within the alternating channels 103 of the bipolar plates 28, 30 created by the tabs 114.

A repeatable finger attachment 101 and/or wired fingers 108 placed or positioned within the alternating channels 103 enables the bare electrical conductors 112 to interact with the bipolar plates 28, 30 as is required for electrical power generation. However, simply placing or positioning the repeatable finger attachment 101 and/or wired fingers 108 within the alternating channels 103 without more is often insufficient to maintain the necessary electrical contact between the bare electrical conductors 112 and the bipolar plates 28, 30.

In this regard, the notch 120 and extended notch 132 of the present assembly 200 enable an external force and/or pressure to be directly applied to the conductors 112. This external pressure or force ensures the requisite contact between the conductors 112 and the plates 28, 30 occurs to generate the electrochemical reaction of the fuel cell stack 12 that produces electrical power (see FIG. 4B). For example, as shown in FIGS. 4A-5, an object, such as a clamping bar 128, may be placed or positioned within the notch 120 or extended notch 132 to provide a necessary amount of force or pressure between the conductors 112 and the plates 28, 30 to ensure proper electrical contact.

In order to help provide the necessary amount of force or pressure onto the conductors 112 and the bipolar plates 28, 30, an object, such as a clamping bar 128, placed within the notch 120 or the extended notch 132 may immobilize the conductors 112. An object, such as the clamping bar 128, within the notch 120 or extended notch 132 may not fit flush to and/or abut the inner wall 130 of the hooked stop 117 (see FIG. 4B), such that a gap or space remains between the object and the hooked stop 117. However, preferably, creation of an assembly 200 would ensure that an object, such as the clamping bar 128, placed within the notch 120 or the extended notch 132 is immobilized, and therefore unable to move, shake, jiggle, vibrate and/or otherwise cause any excess movement that may damage the fuel cell. Further, the immobility of an object, such as the clamping bar 128, in the notch 120 or extended notch 132 is necessary in order to ensure proper contact is maintained between the conductors 112 and the bipolar plates 28, 30. Immobilizing an object, such as a clamping bar 128, within the notch 120 or extended notch 132 is effectuated by the height and width restrictions and/or constraints of the hooked stop 117 and the main stop 118 of the tab 114.

As mentioned, an exemplary object to place within the notch 120 or extended notch 132 of the tab 114 is a clamping bar 128. A clamping bar 128 of the present assembly 200 may comprise any material, such as plastic, ceramic, and/or phenolic. An exemplary clamping bar 128 of the present assembly 200 is made of material that is electrically non-conductive.

In one embodiment, the clamping bar 128 may be made of metal. Any metal clamping bar 128 must comprise a coating or other nonconductive isolation material to ensure the exterior surface of the clamping bar 128 that interacts with the conductors 112 is not conductive. In another embodiment the clamping bar 128 is not made of metal.

Specifically, the clamping bar 128 of the assembly 200 may be positioned within the area of the notch 120, tapered notch 132, or extended notch 132 of the tab 114. Referring back to FIG. 4A, the clamping bar 128 may be positioned within the notch 120 or extended notch 132 by any method or mechanism. Preferably, placing or orienting the clamping bar 128 within the notch 120 or extended notch 132 is conducted by first positioning the bar 128 under the hook 126 of the upper hook portion 124 of the hooked stop 117. Then, the clamping bar 128 may be further positioned within the opposing barriers of the base stop portion 122 of the hooked stop 117 and the main stop 118, as shown in FIG. 4B.

Exemplary mechanisms for positioning the clamping bar 128 within the notch 120, tapered notch 132, or extended notch 132 is enabled by lowering the clamping bar 128 into the notch 120 or extended notch 132 from above (see FIGS. 4A and 4B). In other embodiments, the clamping bar 128 or other objects may be slid into the notch 120 or extended notch 132. In preferred embodiments, the clamping bar 128 or other objects are not slid into the notch 120 or extended notch 132 as doing so could damage electrical connectivity and/or conductivity of a repeatable attachment 101 or wired fingers 108 or the bipolar plates 28, 30 also comprised within the notch 120.

Referring to FIGS. 4A-6, the clamping bar 128 of the present assembly 200 provides a downward pressure or force on the conductors 112 of the repeatable attachment 101 or wired fingers 108 to ensure electrical contact occurs with the bipolar plates 28, 30. Securing the clamping bar 128 in the notch 120 or extended notch 132 of the face 105 of the stack 12 ensures that sufficient pressure or force (e.g., downward force) is placed on the conductors 112 to contact the bipolar plates 28, 30 and generate electrical power. While the clamping bar 128 is generally positioned over as much of the bare electrical conductors 112 of the repeatable finger attachment 101 and the wired fingers 108 as possible to generate as much electrical power as possible, where isolation material 110 is present between the bipolar plates 28, 30 and the conductors 112, no electrical contact will occur (see FIGS. 4A-6). Therefore, no electrical power will be generated by the portion or location of the conductor 112 comprising the isolation material 110.

The clamping bar 128 also enables the bipolar plates 28, 30 of the stack 12 to be attached, connected, and/or adjoined as a single unit for the purposes of monitoring the fuel cell voltage (see FIGS. 5-7). A clamping bar 128 particularly enables the compression of the conductors 112 to the bipolar plates 28, 30 of the fuel cell stack 12 without the use of glue or adhesive. For example, the clamping bar 128 of the assembly 200 may comprise a hole 136 for fasteners (see FIGS. 5 and 6).

One or more holes 136 for fasteners to secure the fuel cell stack 12 together may be located anywhere on the clamping bar 128. In some embodiments, holes 136 are not located in the portion(s) of the clamping bar 128 that are located within the notch 120, 132. Preferred positioning of one or more fastening holes 136 on the clamping bar 128 is at one or more ends of the clamping bar 128 (see FIGS. 5 and 6). Screws, bolts, ties, nails, and/or any other types of non-adhesive fasteners may be coupled with the holes 136 and used to secure the clamping bar 128 to the fuel cell plates 28, 30 (e.g., bipolar plates) by fastening the edges of the stack 12 (e.g., the endplates 134) together. In one embodiment, the clamping bar 128 is secured to the stack 12 along the entire length of the fuel cell stack 12 (see FIG. 6).

In some embodiments, the fuel cell stack 12 will comprise one or more endplates 134 to which the clamping bar 128 may be secured via the one or more holes 136 and/or fasteners. The clamping bar 128 may be secured at an endplate 134, more than one endplate 134, or each endplate 134. Once positioned in the alternating channels 103 of the bipolar plates 28, 30, the repeatable finger attachment 101 and its wired fingers 108 may be repeated along the entire length of the fuel cell stack 12 (e.g., same direction as the clamping bar 128; see FIGS. 5 and 6).

The conductors 112 of the repeated attachment 101 or wired fingers 108 in the present alternating fuel cell assembly 200 are able to measure and/or monitor the voltage being generated by each of the fuel cells 20 and/or fuel cell plates 28, 30 comprised on a face 105 of the stack 12 when connected to a printed circuit board 138. An exemplary printed circuit board 138 comprised in the present assembly 200 is a cell voltage monitoring (CVM) printed circuit board (PCB) 138 that is utilized to ensure that appropriate amounts of power are being generated by each, one or more, and/or a subset of the fuel cells 20 and/or fuel cell plates 28, 30 in the stack 12.

In particular, proper connection between the bipolar plates (BPP) 28, 30 and the conductors 112 of the repeated attachment 101 or wired fingers 108 in a fuel cell stack 12 is extremely critical to optimize efficiency and performance of any fuel cell 20, fuel cell stack 12 or system 10. Accordingly, the present disclosure is also directed to a method 300 of monitoring and/or measuring fuel cell voltage of a fuel cell plate 28, 30 comprising the repeatable finger attachment 101 or the alternating fuel cell assembly 200 described herein. The present methods 300 relate to monitoring and/or measuring the cell voltage of any fuel cell stack 12, fuel cell 20, or bipolar plate 28, 30 in order to ascertain whether a fault, such as any dysfunction or malfunction, in a specific fuel cell BPP 28, 30 has occurred or is occurring.

As previously described, the fuel cell stacks 12 of the present disclosure may have bipolar plates 28, 30 alternated in different directions to provide more than one face 105 on the fuel cell stack 12. For an assembly 200 that has alternating bipolar plates 28, 30 rotated in two different directions, the fuel cell stack 12 will have the first or front face 105 and the second or alternate face 107. Each of the front face 105 and the alternate face 107 will comprise about 50% of the full number of alternating channels 103 in which conductors 112 of the repeatable finger attachment 101 or wired fingers 108 may be positioned (see FIGS. 6 and 7).

Accordingly, conductors 112 located on each of the two faces 105,107 of the assembly embodiment 200 may measure or monitor the voltage generated by each specific alternating plate 28, 30 of about 50% of the fuel cell plates 28, 30 comprised in the stack 12, respectively (see FIGS. 6 and 7). Therefore, conductors 112 located in alternating channels 103 on both the front face 105 and the alternate face 107 of the stack 12 have the collective and cumulative ability to measure and/or monitor the voltage generated by each specific alternating plate 28, 30 of the total (e.g., about 100%) of the fuel cell plates 28, 30 comprised in the stack 12 (e.g., 50% of conductors 112 on the front face 105 and 50% of conductors 112 on the alternate face 107). Fuel cell 20 voltage measuring and/or monitoring of individual cell plates 28, 30 via the present attachment 101, system 10, assembly 200, and/or method 300 may be conducted simultaneously, concurrently, and/or in real-time.

The design of the repeatable finger attachment 101 or the wired fingers 108 to allow specific multiples of conductors 112 will also determine and/or define the number of faces 105,107 that will be required to measure the total voltage (about 100%) generated by all fuel cells 20 or bipolar plates 28, 30 in the stack 12. Ultimately, the present attachment 101, assembly 200, and/or method 300 comprise monitoring and/or measuring the voltage of the conductors 112 of each of the wired fingers 108 attached to the one or more fuel cell plates 28, 30 in the one or more alternating channels 103 on one or more faces 105 of the fuel cell stack 12 without glue or adhesive. In further embodiments of the present attachment 101, assembly 200, and/or method 300, monitoring, measuring, and/or analyzing the voltage of the fuel cell plates 28, 30 comprises the conductors 112 being connected to a printed circuit board 138 at the point of attachment 116 on the wired finger 108 or repeatable finger attachment 101.

Incorporation of the present attachment 101, assembly 200, system 10, and/or method 300 comprising monitoring and/or measuring the fuel cell voltage has particular advantages. Specifically, the present attachment 101, assembly 200, and method 300 increase reliability of the connection between the conductors 112 of the attachment 101 and assembly 200 and the bipolar plates 28, 30 of the stack 12. In addition, utility of the present attachment 101, assembly 200, or method 300 enables the stack 12 to easily be disassembled, taken apart, and/or rebuilt, as necessary. No added steps to clean one or more surfaces comprising glue or adhesive residue is required for the present attachment 101, assembly 200, and method 300 since there is no glue or adhesive or adhesive used in the present system.

In addition, use of the present attachment 101, assembly 200, or method 300 greatly increases the speed of installing the cell voltage monitoring printed circuit board 138 to the plates 28, 30 of the stack 12, particularly on graphite fuel cell plates 28, 30. Therefore, the present attachment 101, assembly 200, or method 300 provide several improvements and advantages for a user's ability to monitor and/or measure the voltage of an individual fuel cell 20 or plate 28, 30 in a stack 12 such that a fault, error, malfunction, or dysfunction on one or more specific plate 28, 30 may be directly identified and/or assessed. In other embodiments, attachments 101 or wired fingers 108 comprising conductors 112 that are not designed to read each individual fuel cell plate 28, 30 in the stack 12, may also indirectly estimate, calculate, and/or predict the voltage of each plate by measuring and/or monitoring a subset of the total plates 28, 30 comprised in the stack 12. For example, in one embodiment, the conductors 112 may be configured to only attach and/or connect to every other, every third, every fourth plate 28, 30 and so on. Nonetheless, the ability of the present methods and apparatuses to detect and/or measure the fuel cell voltage of a fuel cell system without the use of glue or adhesives, such as to more efficiently disassemble and reassemble the fuel cell stack and/or system, is an improved technical benefit and unexpected result over present art.

The following described aspects of the present invention are contemplated and non-limiting:

A first aspect of the present invention relates to a repeatable finger attachment to monitor voltage of a fuel cell stack. The repeatable finger unit comprises one or more wired fingers, and each of the one or more wired fingers has an isolation material and one or more electrical conductors. The isolation material is adapted to surround at least a first portion of the one or more electrical conductors to prevent electrical contact between at least the first portion of the one or more electrical conductors and the fuel cell stack. The one or more electrical conductors are adapted to be positioned in one or more alternating channels of the fuel cell stack to provide electrical contact between a second portion of the one or more electrical conductors and one or more bipolar plates of the fuel cell stack so that an electrochemical reaction is generated by the fuel cell stack to provide electrical power.

A second aspect of the present invention relates to an alternating fuel cell assembly for monitoring fuel cell voltage in a fuel cell stack. The alternating fuel cell assembly comprises one or more bipolar plates, a repeatable finger attachment, and a clamping bar. The one or more bipolar plates are stacked and alternately rotated to create one or more alternating channels. Each of the one or more bipolar plates further comprise a tab. The repeatable finger attachment has one or more wired fingers. Each of the wired fingers are attached to the one or more bipolar on a without glue or adhesive. The clamping bar securely fits into the tab of each of the one or more bipolar plates atop the one or more wired fingers to provide electrical contact between the wired fingers and the one or more bipolar plates.

A third aspect of the present invention relates to a repeatable finger attachment for a fuel cell stack to monitor voltage. The third aspect comprises one or more bipolar plates stacked and alternately rotated to create one or more alternating channels and one or more wired fingers to conduct electricity. Each of the wired fingers are attached to the one or more bipolar plates in the one or more alternating channels on a face of the fuel cell stack without glue or adhesive.

A fourth aspect of the present invention relates to an alternating fuel cell assembly for monitoring fuel cell voltage in a fuel cell stack. The assembly comprises one or more bipolar plates stacked and alternately rotated to create one or more alternating channels, a repeatable finger attachment having one or more wired fingers, and a clamping bar. The one or more bipolar plates further comprise a tab. Each of the wired fingers are attached to the one or more bipolar plates in the one or more alternating channels on a face of the fuel cell stack without glue or adhesive. The clamping bar securely fits into the tab of each of the one or more bipolar plates atop the wired fingers to provide electrical contact between the wired fingers and the one or more bipolar plates.

A fifth aspect of the present invention relates to a fuel cell voltage monitoring system comprising the repeatable finger attachment of the third aspect or the alternating fuel cell assembly of the fourth aspect.

A sixth aspect of the present invention relates to a bipolar plate voltage monitoring system comprising the repeatable finger attachment of the third aspect or the alternating fuel cell assembly of the fourth aspect.

A seventh aspect of the present invention relates to a method for monitoring fuel cell voltage of a fuel cell stack comprising the repeatable finger attachment of the third aspect or the alternating fuel cell assembly of the fourth aspect.

A eighth aspect of the present invention relates to a method for monitoring fuel cell voltage of a bipolar plate monitoring comprising the repeatable finger attachment of the third aspect or the alternating fuel cell assembly of the fourth aspect.

In the first aspect of the present invention, the wired fingers or the conductors may comprise a self-alignment feature within the alternating channels. In the first aspect of the present invention, the wired fingers may self-align in the one or more alternating channels between one or more tabs of the bipolar plates.

In the first aspect of the present invention, each of the wired fingers may be attached to the one or more bipolar plates without glue or adhesive. In the first aspect of the present invention, each of the wired fingers may be attached to the one or more bipolar plates in the one or more alternating channels on an alternate face of the fuel cell stack without glue or adhesive. In the first aspect of the present invention, 100% of the voltage of the fuel cell stack may be simultaneously monitored by each of the wired fingers.

In the second aspect of the present invention, the bipolar plates may be alternately rotated about 90 to about 270 degrees. In the second aspect of the present invention, each of the wired fingers may comprise one or more electrical conductors and an isolation material. In the second aspect of the present invention, the wired fingers or conductors may comprise a self-alignment feature within the alternating channels between one or more tabs of the one or more bipolar plates. In the second aspect of the present invention, the tab may provide electrical isolation between the one or more wired fingers and adjacent bipolar plates.

In the second aspect of the present invention, the tab may comprise a notch. I the second aspect of the present invention, the notch may be tapered.

In the second aspect of the present invention, the clamping bar may comprise a nonconductive material. In the second aspect of the present invention, the clamping bar may provide a downward pressure on one or more wired fingers to make electrical contact between the one or more wired fingers and the one or more bipolar plates. In the second aspect of the present invention, the clamping bar may be secured to the fuel cell stack at an endplate of the fuel cell stack.

In the second aspect of the present invention, the clamping bar may be secured along the entire length of the fuel cell stack. In the second aspect of the present invention, each of the one or more wired fingers may be attached to the one or more bipolar plates without glue or adhesive. In the second aspect of the present invention, each of the one or more wired fingers may be attached to the one or more bipolar plates in the one or more alternating channels on an alternate face of the fuel cell stack without glue or adhesive. In the second aspect of the present invention, 100% of cell voltage may simultaneously monitored by utilizing each of the one or more wired fingers attached to the one or more bipolar plates in the one or more alternating channels on a front face and an alternate face of the fuel cell stack without glue or adhesive.

In the third, fourth, fifth, sixth, seventh, and/or eighth aspects of the present invention, the bipolar plates may be alternately rotated about 90-270 degrees. In the third, fourth, fifth, sixth, seventh, and/or eighth aspects of the present invention, the bipolar plates may be alternately rotated about 180 degrees.

In the third, fourth, fifth, sixth, seventh, and/or eighth aspects of the present invention, the wired fingers may comprise a bare electrical conductor. In the third, fourth, fifth, sixth, seventh, and/or eighth aspects of the present invention, the wired fingers may further comprise an isolation material. In the third, fourth, fifth, sixth, seventh, and/or eighth aspects of the present invention, the wired fingers or conductors may comprise a self-alignment feature within the alternating channels.

In the third, fifth, sixth, seventh, and/or eighth aspects of the present invention, each of the one or more bipolar plates may further comprise a tab. In the third, fourth, fifth, sixth, seventh, and/or eighth aspects of the present invention, the wired fingers may self-align in the alternating channels between one or more tabs of the one or more bipolar plates.

In the third, fourth, fifth, sixth, seventh, and/or eighth aspects of the present invention, the tab may provide electrical isolation between one or more wired fingers and adjacent bipolar plates. In the third, fourth, fifth, sixth, seventh, and/or eighth aspects of the present invention, the tab may be a notched tab. In the third, fourth, fifth, sixth, seventh, and/or eighth aspects of the present invention, the tab may comprise a notch. In the third, fourth, fifth, sixth, seventh, and/or eighth aspects of the present invention, the notch may be tapered.

In the third, fifth, sixth, seventh, and/or eighth aspects of the present invention, the repeatable finger attachment, assembly, apparatus, and/or system may further comprise a clamping bar. In the third, fourth, fifth, sixth, seventh, and/or eighth aspects of the present invention, the clamping bar may provide a downward pressure on the wired fingers to provide electrical contact with the one or more bipolar plates. In the third, fourth, fifth, sixth, seventh, and/or eighth aspects of the present invention, the clamping bar may be nonconductive. In the third, fourth, fifth, sixth, seventh, and/or eighth aspects of the present invention, the clamping bar may be secured to the fuel cell stack. In the third, fourth, fifth, sixth, seventh, and/or eighth aspects of the present invention, the clamping bar may be secured to the fuel cell stack at an endplate. In the third, fourth, fifth, sixth, seventh, and/or eighth aspects of the present invention, the clamping bar may be secured to the fuel cell at each endplate of the fuel cell stack. In the third, fourth, fifth, sixth, seventh, and/or eighth aspects of the present invention, the clamping bar may be secured along the entire length of the fuel cell stack.

In the third, fourth, fifth, sixth, seventh, and/or eighth aspects of the present invention, the face of the fuel cell stack may comprise a first face and a second face. In the third, fourth, fifth, sixth, seventh, and/or eighth aspects of the present invention, the first face may be a front face and the second face may be an alternate face. In the third, fourth, fifth, sixth, seventh, and/or eighth aspects of the present invention, each of the wired fingers may be attached to the one or more bipolar plates in the one or more alternating channels on the front face of the fuel cell stack without glue or adhesive. In the third, fourth, fifth, sixth, seventh, and/or eighth aspects of the present invention, each of the wired fingers may be attached to the one or more bipolar plates in the one or more alternating channels on the alternate face of the fuel cell stack without glue or adhesive. In the third, fourth, fifth, sixth, seventh, and/or eighth aspects of the present invention, 100% of the cell voltage may be simultaneously monitored by utilizing each of the wired fingers attached to the one or more bipolar plates in the one or more alternating channels on the front face and alternate face of the fuel cell stack without glue or adhesive.

The features illustrated or described in connection with one exemplary embodiment may be combined with any other feature or element of any other embodiment described herein. Such modifications and variations are intended to be included within the scope of the present disclosure. Further, a person skilled in the art will recognize that terms commonly known to those skilled in the art may be used interchangeably herein.

The above embodiments are described in sufficient detail to enable those skilled in the art to practice what is claimed and it is to be understood that logical, mechanical, and electrical changes may be made without departing from the spirit and scope of the claims. The detailed description is, therefore, not to be taken in a limiting sense.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Specified numerical ranges of units, measurements, and/or values comprise, consist essentially or, or consist of all the numerical values, units, measurements, and/or ranges including or within those ranges and/or endpoints, whether those numerical values, units, measurements, and/or ranges are explicitly specified in the present disclosure or not.

Unless defined otherwise, technical and scientific terms used herein have the same meaning as is commonly understood by one of ordinary skill in the art to which this disclosure belongs. The terms "first," "second," "third" and the like, as used herein do not denote any order or importance, but rather are used to distinguish one element from another. The term "or" is meant to be inclusive and mean either or all of the listed items. In addition, the terms "connected" and "coupled" are not restricted to physical or mechanical connections or couplings, and can include electrical connections or couplings, whether direct or indirect.

Moreover, unless explicitly stated to the contrary, embodiments "comprising," "including," or "having" an element or a plurality of elements having a particular property may include additional such elements not having that property. The term "comprising" or "comprises" refers to a composition, compound, formulation, or method that is inclusive and does not exclude additional elements, components, and/or method steps. The term "comprising" also refers to a composition, compound, formulation, or method embodiment of the present disclosure that is inclusive and does not exclude additional elements, components, or method steps.

The phrase "consisting of" or "consists of" refers to a compound, composition, formulation, or method that excludes the presence of any additional elements, components, or method steps. The term "consisting of" also refers to a compound, composition, formulation, or method of the present disclosure that excludes the presence of any additional elements, components, or method steps.

The phrase "consisting essentially of" or "consists essentially of" refers to a composition, compound, formulation, or method that is inclusive of additional elements, components, or method steps that do not materially affect the characteristic(s) of the composition, compound, formulation, or method. The phrase "consisting essentially of" also refers to a composition, compound, formulation, or method of the present disclosure that is inclusive of additional elements, components, or method steps that do not materially affect the characteristic(s) of the composition, compound, formulation, or method steps.

Approximating language, as used herein throughout the specification and claims, may be applied to modify any quantitative representation that could permissibly vary without resulting in a change in the basic function to which it is related. Accordingly, a value modified by a term or terms, such as "about," and "substantially" is not to be limited to the precise value specified. In some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

It is to be understood that the above description is intended to be illustrative, and not restrictive. For example, the above-described embodiments (and/or aspects thereof) may be used individually, together, or in combination with each other. In addition, many modifications may be made to adapt a particular situation or material to the teachings of the subject matter set forth herein without departing from its scope.

While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A repeatable finger attachment to monitor voltage of a fuel cell stack comprising:

one or more wired fingers, each of the one or more wired fingers having an isolation material and one or more electrical conductors, two bipolar plates, each of the two bipolar plates including a tab having a hooked stop extending outwardly from the corresponding bipolar plate and a main stop extending outwardly from the corresponding bipolar plate in spaced apart relation to the corresponding hooked stop, the hooked stop and the main stop of each of the two bipolar plates defining a respective notch therebetween, wherein the isolation material is adapted to surround at least a first portion of the one or more electrical conductors to prevent electrical contact between at least the first portion of the one or more electrical conductors and the fuel cell stack, wherein the one or more electrical conductors are adapted to be positioned in one or more alternating channels formed between the two bipolar plates of the fuel cell stack to provide electrical contact between a second portion of the one or more electrical conductors and one or more of the two bipolar plates of the fuel cell stack so that an electrochemical reaction is generated by the fuel cell stack to provide electrical power.

2. The repeatable finger attachment of claim 1, wherein the one or more wired fingers or the one or more electrical conductors comprise a self-alignment within the one or more alternating channels.

3. The repeatable finger attachment of claim 2, wherein the one or more wired fingers self-align in the one or more alternating channels between the tabs of the two bipolar plates.

4. The repeatable finger attachment of claim 1, wherein each of the one or more wired fingers are attached to the two bipolar plates without glue or adhesive.

5. The repeatable finger attachment of claim 1, wherein a first portion of the one or more wired fingers are attached to the two bipolar plates on a front face of the fuel cell stack and a second portion of the one or more wired fingers are attached to the two bipolar plates on a back face of the fuel cell stack opposite the front face.

6. The repeatable finger attachment of claim 5, wherein 100% of the voltage of the fuel cell stack is simultaneously monitored by each of the one or more wired fingers.

7. An alternating fuel cell assembly for monitoring fuel cell voltage in a fuel cell stack comprising:

two or more bipolar plates stacked and alternately rotated to create one or more alternating channels, wherein each of the two or more bipolar plates further comprise a tab, a repeatable finger attachment having one or more wired fingers, wherein each of the one or more wired fingers are attached to the two or more bipolar plates on a front face without glue or adhesive, and a clamping bar that securely fits into the tab of each of the two or more bipolar plates atop the one or more wired fingers to provide electrical contact between the one or more wired fingers and the two or more bipolar plates, wherein the clamping bar is secured along the entire length of the fuel cell stack.

8. The alternating fuel cell assembly of claim 7, wherein the two or more bipolar plates are alternately rotated about 90 to about 270 degrees.

9. The alternating fuel cell assembly of claim 7, wherein each of the one or more wired fingers comprise one or more electrical conductors and an isolation material.

10. The alternating fuel cell assembly of claim 7, wherein the one or more wired fingers self-align within the alternating channels between one or more tabs of the two or more bipolar plates.

11. The alternating fuel cell assembly of claim 7, wherein the tab provides electrical isolation between the one or more wired fingers and adjacent bipolar plates.

12. The alternating fuel cell assembly of claim 7, wherein the tab comprises a notch.

13. The alternating fuel cell assembly of claim 12, wherein the notch is tapered.

14. The alternating fuel cell assembly of claim 7, wherein the clamping bar comprises a nonconductive material.

15. The alternating fuel cell assembly of claim 14, wherein the clamping bar provides a downward pressure on the one or more wired fingers to make electrical contact between the one or more wired fingers and the two or more bipolar plates.

16. The alternating fuel cell assembly of claim 14, wherein the clamping bar is secured to the fuel cell stack at an endplate of the fuel cell stack.

17. The alternating fuel cell assembly of claim 7, further comprising a second repeatable finger attachment having one or more wired fingers, and wherein each of the one or more wired fingers of the second repeatable finger attachment are attached to the two or more bipolar plates in the one or more alternating channels on a back face of the fuel cell stack opposite the front face.

18. The alternating fuel cell assembly of claim 17, wherein 100% of cell voltage is simultaneously monitored by utilizing each of the one or more wired fingers of the repeatable finger attachment and the second repeatable finger attachment attached to the two or more bipolar plates in the one or more alternating channels on the front face and the back face of the fuel cell stack.

* * * * *